United States Patent [19]

Preisler et al.

[11] Patent Number: 5,328,890

[45] Date of Patent: Jul. 12, 1994

[54] PROCESS FOR PRODUCING MOLDED BODIES FROM PRECURSORS OF HIGH-TEMPERATURE SUPERCONDUCTORS

[75] Inventors: Eberhard Preisler; Joachim Bock, both of Erfstadt, Fed. Rep. of Germany

[73] Assignee: Hoechst Aktiengesellschaft, Frankfurt am Main, Fed. Rep. of Germany

[21] Appl. No.: 993,824

[22] Filed: Dec. 18, 1992

Related U.S. Application Data

[63] Continuation of Ser. No. 739,883, Aug. 2, 1991, abandoned.

[30] Foreign Application Priority Data

Aug. 17, 1990 [DE] Fed. Rep. of Germany ....... 4026017

[51] Int. Cl.$^5$ .................. H01L 39/12; B29C 33/76
[52] U.S. Cl. .................. 505/450; 264/317; 264/332; 505/739; 505/410
[58] Field of Search .................. 505/1, 739, 782; 264/332, 317, 313

[56] References Cited

U.S. PATENT DOCUMENTS

| | | | |
|---|---|---|---|
| 2,974,388 | 3/1961 | Ault | 264/317 |
| 3,429,962 | 2/1969 | Krystyniak | 264/317 |
| 5,047,391 | 9/1991 | Bock et al. | 505/1 |
| 5,215,961 | 6/1993 | Rayne et al. | 505/739 |

FOREIGN PATENT DOCUMENTS

| | | |
|---|---|---|
| 0327044 | of 1989 | European Pat. Off. |
| 362492 | 4/1990 | European Pat. Off. |
| 3830092 | 3/1990 | Fed. Rep. of Germany |

OTHER PUBLICATIONS

World Patents Index 91-15945 [22], 1991 (Abstract only).
World Patents Index, 80 85484C [48], 1980 (Abstract only).

Primary Examiner—Jan H. Silbaugh
Assistant Examiner—Christopher A. Fiorilla
Attorney, Agent, or Firm—Connolly & Hutz

[57] ABSTRACT

To produce more complex molded bodies from precursors of high-temperature superconductors based on the oxides of bismuth, strontium, calcium and copper, the homogeneous melt of these oxides is cast in molds at temperatures of 870° to 1000° C. In this process, the geometrically appropriately shaped molds are composed of a material having a melting point of at least 1000° C. Finally, the molds containing solidified melt of the oxides of bismuth, strontium, calcium and copper are treated with dilute hydrofluoric acid at temperatures of 20° to 90° C. until the molds are dissolved.

4 Claims, No Drawings

PROCESS FOR PRODUCING MOLDED BODIES FROM PRECURSORS OF HIGH-TEMPERATURE SUPERCONDUCTORS

This application is a continuation of application Ser. No. 07/739,883 filed on Aug. 2, 1991, now abandoned.

The present invention relates to a process for producing more complex molded bodies from precursors of high-temperature superconductors based on the oxides of bismuth, strontium, calcium and copper by casting the homogeneous melt of these oxides in molds at temperatures of 870° to 1000° C.

German Offenlegungsschrift 3,830,092 discloses a process for producing a high-temperature superconductor of the composition $Bi_2(Sr,Ca)_3Cu_2O_x$ having values for x of 8 to 10. In this process, stoichiometric mixtures of the oxides or carbonates of bismuth, strontium, calcium and copper are heated at temperatures of 870° to 1100° C. to form a homogeneous melt having an oxygen deficiency. Said melt is cast in molds and solidifies therein. The cast bodies removed from the molds are tempered for 6 to 30 hours at 780° to 850° C. and then treated in an oxygen atmosphere at 600° to 830° C. for at least 6 hours to eliminate the oxygen deficiency. In this way, it is possible to produce platelets of up to several cm edge length or diameter and also rods having a length of up to 50 cm and a diameter of 10 mm which are always composed of the phase-pure compound.

A disadvantage of the known process is that only simple molded bodies such as blocks or half-cylinders which can be tipped out of the open molds after they have solidified and can then be converted into high-temperature superconductors by tempering in an oxygen atmosphere can be produced thereby.

It is therefore the object of the present invention to provide a process for producing more complex molded bodies, for example of annular parts or spirals, from precursors of high-temperature superconductors based on the oxides of bismuth, strontium, calcium and copper by casting their homogeneous melt in molds, in which process the molded bodies present after solidification of the melt can be freed in a simple way from the mold and then submitted to a tempering in an oxygen atmosphere without the molded bodies being damaged or attacked. This is achieved, according to the invention, by a process wherein the geometrically appropriately shaped molds are composed of a material having a melting point of at least 1000° C. and wherein the molds containing solidified melt of the oxides of bismuth, strontium, calcium and copper are treated with dilute hydrofluoric acid at temperatures of 20° to 90° C. until the molds are dissolved.

The process according to the invention may furthermore optionally also be developed as one wherein
 a) the molds are composed of copper;
 b) nitric acid is added to the hydrofluoric acid;
 c) hydrofluoric acid and nitric acid of approximately equal concentration are used;
 d) the molds are composed of material containing silicon dioxide;
 e) quartz glass is used;
 f) glass, in particular borosilicate glass, is used;
 g) the hydrofluoric acid contains 5 to 30% by weight of HF.

In the process according to the invention the molds are dissolved in a few hours, while the molded bodies composed of the oxides of bismuth, strontium, calcium and copper are virtually not attacked, which is apparently to be ascribed to the formation of a layer of fluorides of strontium and calcium on the surface of the molded bodies.

In the process according to the invention, the use of glass or quartz glass as mold material also makes it possible to produce geometrically complicated molded bodies since the production of the appropriate molds by standard glass blowing techniques is relatively simple.

EXAMPLE 1

Equal-area pieces of copper sheet (13.8 cm$^2$; 4.64 g) and a molded body of solidified oxides of bismuth, strontium, calcium and copper (14.0 cm$^2$; 13.4 g) were treated with 200 ml of a mixture of nitric acid and hydrofluoric acid, each of 16% strength, at 50° C.

While the copper sheet was almost completely dissolved even after one hour, the weight loss of the molded body was less than 2 mg at this point in time. After further exposing the molded body to the mixture for 6 hours, its weight loss was, at 11 mg, less than 0.1% or 0.8 mg/cm$^2$.

EXAMPLE 2

Equal-area pieces of Duran glass (14 cm$^2$; 2.36 g) and a molded body of solidified oxides of bismuth, strontium, calcium and copper (7 cm$^2$; 7.54 g) were treated with 200 ml of 16% hydrofluoric acid at 50° C. After 8 hours, 2.10 g ($\triangleq$89%) of the Duran glass had dissolved, whereas the weight loss of the molded body was 3 mg ($\triangleq$0.04%).

EXAMPLE 3

Example 2 was repeated with the modification that treatment was carried out with 30% hydrofluoric acid. While the Duran glass had dissolved completely after 3.5 hours, the weight loss of the molded body at this point in time was 6 mg ($\triangleq$0.07%).

We claim:

1. A process for producing geometrically complicated molded bodies made from precursors of high-temperature superconductors based on the oxides of bismuth, strontium, calcium and copper, which comprises heating a mixture of said oxides to temperatures of 870° to 1000° C. to form a homogeneous melt; casting the homogeneous melt in geometrically appropriately shaped molds made of a material containing silicon dioxide and having a melting point of at least 1000° C.; allowing the homogeneous melt to solidify in said molds with the resultant formation of molded bodies; and treating the molds containing said molded bodies with hydrofluoric acid containing 5 to 30% by weight of HF at temperatures of 20° to 90° C. until the molds are dissolved, wherein a layer of fluorides of strontium and calcium is formed on the surface of the molded bodies, whereby the molded bodies are virtually not attacked by said acid.

2. The process as claimed in claim 1, wherein quartz glass serves as the material containing silicon dioxide.

3. The process as claimed in claim 1, wherein glass serves as the material containing silicon dioxide.

4. The process as claimed in claim 1, wherein borosilicate glass serves as the material containing silicon dioxide.

* * * * *